(12) United States Patent
Nakajima et al.

(10) Patent No.: US 7,465,624 B2
(45) Date of Patent: Dec. 16, 2008

(54) METHOD OF MANUFACTURING SEMICONDUCTOR DEVICE

(75) Inventors: Kazuaki Nakajima, Tokyo (JP); Atsushi Yagishita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 11/540,708

(22) Filed: Oct. 2, 2006

(65) Prior Publication Data

US 2007/0099385 A1    May 3, 2007

(30) Foreign Application Priority Data

Oct. 27, 2005    (JP)    ............... 2005-313258

(51) Int. Cl.
   *H01L 21/8238*    (2006.01)
(52) U.S. Cl. ............... 438/233; 438/592; 257/E21.636
(58) Field of Classification Search ............... 438/233, 438/592; 257/E21.636
   See application file for complete search history.

(56) References Cited

U.S. PATENT DOCUMENTS 6,376,888 B1 *    4/2002    Tsunashima et al. ........ 257/407
6,383,879 B1 *    5/2002    Kizilyalli et al. ............ 438/592
6,727,129 B1    4/2004    Nakajima
6,841,429 B2 *    1/2005    Matsuda et al. ............. 438/592

FOREIGN PATENT DOCUMENTS

| JP | 2001-176985 | 6/2001 |
| JP | 2004-152995 | 5/2004 |

* cited by examiner

*Primary Examiner*—Chandra Chaudhari
(74) *Attorney, Agent, or Firm*—Finnegan, Henderson, Farabow, Garrrett & Dunner, L.L.P.

(57) ABSTRACT

The present invention provides a method of manufacturing a semiconductor device, comprising forming an electrode pattern made of silicon on a gate insulating film in an n-MOS region and a p-MOS region of a semiconductor substrate, masking the n-MOS region including the first electrode pattern with a first insulating film pattern, forming a first metal film made of platinum all over the surface, forming a gate electrode consisting of a platinum silicide in the p-MOS region, forming an silicon oxide film on the surface of the gate electrode by oxidation, dissolving away a non-reacting Pt film, removing the first insulating film pattern, masking the p-MOS region including the electrode pattern with a second insulating film pattern, forming a second metal film made of europium all over the surface, and forming a gate electrode consisting of a europium silicide in the n-MOS region.

14 Claims, 6 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-313258, field Oct. 27, 2005, the entire contents of which are incorporated herein by reference.

BACKGROUND OF THE INVENTION

1. Field of the Invention

The present invention relates to a method of manufacturing a semiconductor device.

2. Description of the Related Art

In MOSFET technology, device miniaturization has proceeded to achieve higher performance. However, there is a limit to the scaling of the gate insulating film in a device of the 0.1 μm generation and later. This results from actualization of an increase of gate leakage current due to tunnel current as the gate insulating film gets thinner. Further, in this generation, depletion of the gate electrode cannot be ignored, and it became difficult to achieve a decreased effective thickness of the gate insulating film. Specifically, as shown in the ITRS Road Map of 2003, it is difficult to implement a transistor with a conventional polycrystalline silicon electrode in a physical film thickness region of less than 1.0 nm.

As methods to avoid these problems, increasing the permittivity of the gate insulating film and using a metal gate electrode are considered. The former is to increase the physical film thickness and to suppress the tunnel current by replacing the gate insulating film with a high dielectric film. The latter is to prevent depletion in the gate electrode by metallization of the gate electrode. Recently, materials development especially on high dielectric gate insulating films has been vigorously pursued, new materials such as $ZrO_2$ and $HfO_2$ has been presented at academic meetings, and decreasing the thickness of an effective oxide film is the object of commercial competitor. However, a sufficient inspection of characteristics including reliability of these materials, like that of the conventional silicon oxide film, has not been done.

Although the investigation of the above-described metal gate electrode is slower than the development of the high dielectric film, the ratio of the depletion in the gate electrode against the thickness of the effective oxide film is about 0.3 nm. Thus, development of the metal gate electrode is necessary in order to obtain prolonged use of silicon-based oxide film until this generation.

Especially, a process of a full-silicide electrode disclosed in Jpn. Pat. Appln. KOKAI Publication No. 2004-152995 is superior in consistency to the conventional CMOS process, and competitive development has proceeded. However, in order to completely substitute the conventional CMOS, formation of silicide electrodes having an appropriate work function for each n-MOS transistor and p-MOS transistor is necessary to be formed.

BRIEF SUMMARY OF THE INVENTION

According to one aspect of the present invention, there is provided a method of manufacturing a semiconductor device, comprising:

forming an electrode pattern made of at least one element selected from silicon and germanium on a gate insulating film in an n-MOS region and a p-MOS region of a semiconductor substrate;

masking the n-MOS region including the first electrode pattern with a first insulating film pattern;

forming a first metal film made of Pd, Pt, Rh, Ir, or their alloys all over the surface;

forming a gate electrode consisting of a reactant between the first metal and at least one element selected from silicon and germanium by heating to react the first metal film with the electrode pattern in the p-MOS region contacting with the first metal film;

forming an oxide film of at least one element selected from silicon and germanium on the surface of the gate electrode by oxidation;

dissolving away a non-reacting first metal film with an acid solution in which the first metal is soluble;

removing the first insulating film pattern;

masking the p-MOS region including the electrode pattern with the a second insulating film pattern;

forming a second metal film made of Er, Y, Gd, Tm, Dy, Ce, or their alloys all over the surface;

forming a gate electrode consisting of a reactant between the second metal and at least one element selected from silicon and germanium by heating to react the second metal film with the electrode pattern in the n-MOS region contacting with the second metal film; and dissolving away a non-reacting second metal film with an acid solution in which the second metal is soluble.

DETAILED DESCRIPTION OF THE INVENTION

A method of manufacturing a semiconductor device according to one embodiment of the invention will be explained in detail below.

(First Step)

An electrode pattern made of at least one element selected from silicon and germanium is formed on a gate insulating film in an n-MOS region and a p-MOS region of a semiconductor substrate.

Examples of the gate insulating film include a silicon oxynitride film, a silicon oxide film, and a silicon nitride film. The method of forming the gate insulating film can be adopted from any method such as thermal oxynitriding and a CVD method. Further, the gate insulating film is not limited to a silicon-based oxide film, and may be an insulating film having a higher permittivity than a silicon oxide film, such as an oxide film of Hf, Zr, Ti, Ta, Al, Sr, Y, La, and a composite oxide film such as $ZrSi_xO_y$ film having the element such as zirconium and silicon. Furthermore, the gate insulating film may be a layered film of the above-described oxide films.

Although an electrode pattern in the n-MOS region and the p-MOS region can be formed in separate steps, it is preferably formed in a same step from the point of view of minimizing the process.

The electrode pattern is made from silicon by itself, germanium by itself, or an Si-Ge alloy.

(Second Step)

The n-MOS region including the electrode pattern is masked with a first insulating film pattern. Subsequently, a first metal film made of Pd, Pt, Rh, Ir or their alloys is formed all over the surface. At this time, the first metal film is in contact with the p-MOS region exposed from the first insulating film pattern. That is, the first metal film is in contact with the p-MOS region including the electrode pattern.

The first insulating film is formed by forming an insulating film composed of, for example, a silicon oxide film or the like, all over the surface, forming a resist pattern on the insulating film by photolithography, and then selectively etching the insulating film using the resist pattern as a mask.

Examples of the alloys include alloys of Pd, Pt, Rh, or Ir with Ni or Co.

(Third Step)

A gate electrode consisting of a reactant between the first metal and at least one element selected from silicon and germanium, for example a silicide of the first metal, is formed by heating to react the first metal film with the electrode pattern in the p-MOS region contacting with the first metal film. Successively, an oxide film of at least one element selected from silicon and germanium is formed on the surface of the gate electrode by oxidation. Thereafter, a non-reacting first metal film is dissolved away with an acid solution in which the first metal is soluble. To be more specific, a residual part of the first metal film left without reacting in the region except the electrode pattern in the p-MOS region is dissolved away with the acid solution.

When, in the process of dissolving away the non-reacting part of the first metal film with the acid solution, the gate electrode is also dissolved with the acid solution, because the gate electrode consists of the reactant, e.g., the silicide of the first metal and is exposed. In the embodiment, an oxide film is formed on the gate electrode prior to dissolution of the non-reacting part of the first metal film with the acid solution, and consequently, the gate electrode can be prevented from being dissolved.

The above-described heating, depending on the type of the first metal film, is preferably performed in a non-oxidizing atmosphere or a vacuum at 250 to 450° C.

The above-described oxidation process can be adopted from processes such as a thermal oxidation process in which the oxidation is performed generally in an atmosphere containing oxygen (for example, pure oxygen, a mixed gas of oxygen and an inert gas such as nitrogen, or a steam atmosphere) at 300 to 600° C., and an ozone plasma process.

The thickness of the oxide film to be formed on the gate electrode is preferably 3 to 10 nm.

Examples of the acid solution used include a mixed acid solution of nitric acid and hydrochloric acid. The mixed acid solution preferably has a composition where the nitric acid and the hydrochloric acid are mixed at a weight ratio of 1:3 to 1:1. The acid solution is permissibly used by heating to 30 to 120° C.

(Fourth Step)

After the first insulating film pattern is removed, the p-MOS region including the electrode pattern is masked with a second insulating film pattern. Successively, a second metal film made of Er, Y, Gd, Tm, Dy, Ce or their alloys is formed all over the surface. At this time, the second metal film is in contact with the n-MOS region exposed from the second insulating film pattern. That is, the second metal film is in contact with the n-MOS region including the electrode pattern.

The second insulating film pattern is formed by forming an insulating film composed of, for example, a silicon oxide film all over the surface, forming a resist pattern on the insulating film by photolithography, and then selectively etching the insulating film using the resist pattern as a mask.

Examples of the alloys include alloys of Er, Y, Gd, Tm, Dy, or Ce with Ni or Co.

(Fifth Step)

A gate electrode consisting of a reactant between the second metal film and at least one element selected from silicon and germanium, for example, a silicide of the second metal, is formed by heating to react the second metal film with the electrode pattern in the n-MOS region contacting with the second metal film. Subsequently, a non-reacting second metal film is dissolved away with an acid solution in which the second metal is soluble. To be specific, a residual part of the second metal film left without reacting in the region except the electrode pattern in the n-MOS region is dissolved away with the acid solution.

With these first to fifth steps, a semiconductor device with a p-MOS and an n-MOS having gate electrodes of different work functions respectively is manufactured.

The above-described heating, depending on the type of the second metal film, is preferably performed in a non-oxidizing atmosphere or a vacuum at 250 to 450° C.

Examples of the acid solution used include a mixed acid solution of sulfuric acid and hydrogen peroxide. The mixed acid solution preferably has a composition where the sulfuric acid and the hydrogen peroxide are mixed at a weight ratio of 1:1 to 1:2. The acid is permissibly used by heating to 30 to 120° C.

Further, in the manufacture of the semiconductor device of the embodiment, either formation of the gate electrode in the p-MOS region or formation of the gate electrode in the n-MOS region may have priority. However, as described later, formation of the gate electrode in the p-MOS region has priority and then formation of the gate electrode in the n-MOS region is preferably performed. In the sequence of forming the gate electrode, a barrier metal film selected from films such as titanium nitride film, tantalum nitride, and tantalum aluminum film to prevent oxidation of the second metal film is permissively layered after the formation of the second metal.

Above, according to the embodiments, a gate electrode is formed in the p-MOS region in the following manner. That is, after masking the n-MOS region including the electrode pattern with the insulating film pattern, the first metal film is formed in the p-MOS region including the electrode pattern, and heating to react the first metal film with an electrode pattern in the p-MOS region contacting with the first metal film, thereby forming a gate electrode consisting of a reactant between the first metal and at least one element selected from silicon and germanium. An oxide film of at least one element selected from silicon and germanium is formed on the surface of the gate electrode by oxidation, and then, the non-reacting first metal film is dissolved away with an acid solution in which the first metal is soluble. Consequently, only the non-reacting first metal film can be dissolved away with the acid solution without dissolving the gate electrode which has already been formed.

More specifically, the present inventors have found following a matter. That is, when the non-reacting platinum (Pt) film is dissolved away with a mixed acid solution, for example, nitric acid and hydrochloric acid, after forming a gate electrode consisting of a reactant between the first metal and at least one element selected from silicon and germanium (for example, a gate electrode consisting of platinum silicide) by heating to react the first metal film with the electrode pattern in the p-MOS region contacting with the first metal film, the gate electrode consisting of platinum silicide exposed is dissolved away along with a platinum film.

Accordingly, the present inventors have found that only the non-reacting platinum film can be dissolved away without the gate electrode dissolving in the mixed acid solution by forming the gate electrode consisting of platinum silicide, and then oxidizing, for example, thermal-oxidization applying to form a silicon oxide film, which is not soluble in a mixed acid solution of nitric acid and hydrochloric acid, on the surface of the gate electrode consisting of platinum silicide.

Therefore, a gate electrode consisting of a reactant between the second metal such as europium (Er) and at least one element selected from silicon and germanium is formed in the n-MOS region after or before forming a gate electrode in the p-MOS region. As a consequence, it is possible to manufacture a semiconductor device comprising a p-MOS and an n-MOS having gate electrodes of different work functions respectively, and preventing depletion in the gate electrode to achieve a decreased effective thickness of the gate insulating film.

Especially, by forming a gate electrode in the p-MOS region with priority and then proceeding to form a gate electrode in the n-MOS region, it is possible to manufacture a semiconductor device comprising a p-MOS and an n-MOS having gate electrodes of different work functions respectively, preventing depletion in the gate electrode to achieve a decreased effective thickness of the gate insulating film, and having high reliability.

Assume that, in the process of selectively forming the metal film in the p-MOS region and the n-MOS region, the n-MOS region is selected first. In this case, the n-MOS region having formed therein the gate electrode consisting of a reactant between the second metal film such as europium (Er) and at least one element selected from silicon and germanium (for example, a gate electrode consisting of europium silicide) is exposed to the acid solution for use dissolving away non-reacting Pt film in the p-MOS region and oxidizing atmosphere described above. In these steps in the p-MOS region, the previously formed gate electrode consisting of europium silicide in the n-MOS region is covered with the insulating film pattern. However, the ends of the insulating film pattern are shifted to the n-MOS region side at the border where the n-MOS region in the longitudinal direction of the gate electrodes and the p-MOS region are connected, and the gate electrode consisting of europium silicide is possible to be exposed. Because europium silicide is easily oxidized, the gate electrode which has been already formed in the n-MOS region changes to an oxide of europium and silicon by the above-described oxidation in the p-MOS region, and loses its functions as a gate electrode.

On the other hand, assume that, in order to prevent the exposure of the gate electrode consisting of europium silicide in the n-MOS region at the border where the n-MOS region in the longitudinal direction of the gate electrodes and the p-MOS region are connected, the insulating film pattern is formed to cross over a part of the p-MOS region from the n-MOS region. In this case, since the gate electrode portion of the p-MOS region located at the border does not react with the first metal film, at least one element selected from silicon and germanium (for example, silicon) is left in a part of the gate electrode in the p-MOS region. Therefore, each gate electrode at the border cannot be connected with europium silicide and platinum silicide.

In this manner, the first metal film (for example, a platinum film) is first formed on the p-MOS region including the electrode pattern consisting of, for example, silicon, a gate electrode consisting of platinum silicide is formed by heating and reacting the platinum film with the electrode pattern in the p-MOS region contacting with the platinum film, and a silicon oxide film, for example, is formed on the surface of the gate electrode. Then, a non-reacting platinum film is dissolving away with an acid solution (for example, a mixed acid solution of nitric acid and hydrochloric acid) in which the metal is soluble. Further, the second metal film (for example, a europium film) is formed on the n-MOS region including the electrode pattern made of, for example, silicon, and a gate electrode consisting of europium silicide is formed by heating and reacting the europium film with the electrode pattern in the n-MOS region contacting with the europium film. Accordingly, silicides, for example, platinum silicide and europium silicide can be formed respectively at the border where the p-MOS region in the longitudinal direction of the gate electrodes and the n-MOS region are connected. In addition, it is possible to manufacture a semiconductor device comprising a p-MOS and an n-MOS having gate electrodes of different work functions respectively, and preventing depletion in the gate electrode to achieve a decreased effective thickness of the gate insulating film.

As indicated above, the gate electrode made of platinum silicide has been formed, with one end of the second insulating film pattern shifted toward the p-MOS region in the lengthwise direction of the gate electrode. The gate electrode may be exposed at the border of the p-MOS region and the n-MOS region when the gate electrode made of europium silicide is formed by reacting europium with the electrode pattern provided in the n-MOS region. Even if the gate electrode made of platinum silicide is exposed, platinum silicide is not dissolved with the acid solution that can dissolve the non-reacting europium film. Hence, the gate electrode made of platinum silicide is prevented from taking place an alternation such as an oxidation. This helps to manufacture a semiconductor device of high reliability.

Now, the examples of the present invention will be explained with reference to the drawings.

EXAMPLE 1

FIGS. 1A to 1G are cross-sectional views each showing the steps of manufacturing a CMOS transistor in Example 1, and FIGS. 2A to 2F are longitudinal sectional views of gate electrodes shown in FIGS. 1A to 1F.

Figure 1A:
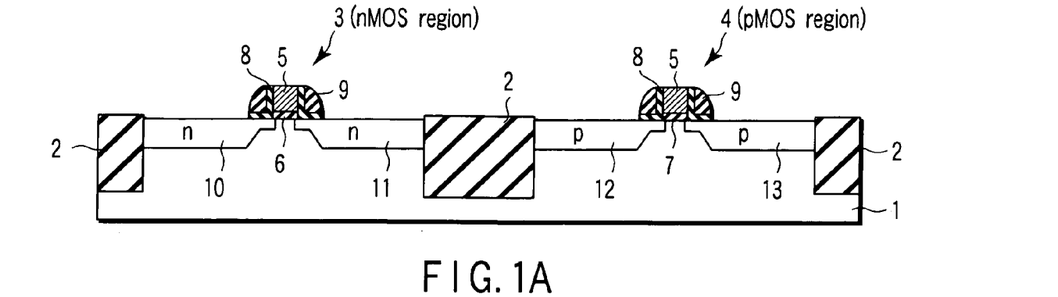
FIGS. 1A, 1B, 1C, 1D, 1E, 1F and 1G are cross-sectional views showing the steps of manufacturing a CMOS transistor in Example 1.
Figure 2A:
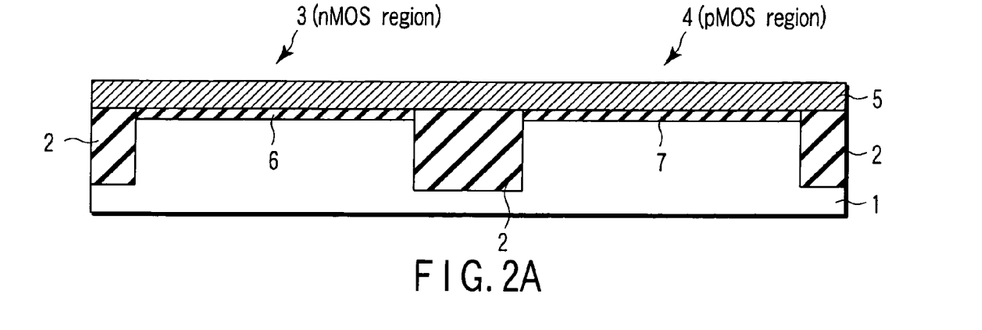
FIGS. 2A, 2B, 2C, 2D, 2E and 2F are longitudinal sectional views of gate electrodes shown in FIGS. 1A, 1B, 1C, 1D, 1E and 1F, respectively.

First, by forming an element isolator 2 on a single crystal silicon substrate 1 as shown in FIGS. 1A and 2A, the surface of the single crystal silicon substrate 1 was isolated into a plurality of an n-MOS region 3 and a p-MOS region 4. Then, a gate insulating film such as a silicon oxynitride film was formed on the single crystal silicon substrate 1 located in the n-MOS region 3 and the p-MOS region 4 respectively, and a polycrystalline silicon film was deposited all over the surface. Subsequently, the polycrystalline silicon film was etched anisotropically using a resist pattern as a mask to form a plurality of electrode patterns 5. The silicon oxynitride film is removed by etching selectively using these electrode patterns 5, whereby gate insulating films 6 and 7 were formed respectively. Further, by using the electrode patterns 5 as masks, the substrate 1 located in the n-MOS region 3 was implanted with ions such as $As^+$ ions, the substrate 1 located in the p-MOS region 4 was implanted with ions such as B⁺ ions, and a heat treatment was performed at 800° C. for 5 seconds. Accordingly, a shallow diffusion layer was formed. Further, after a silicon nitride film and a silicon oxide film were deposited successively, the silicon oxide film and the silicon nitride film were etched back to form a structure in which the side-wall part of the electrode patterns 5 was surrounded by a silicon nitride film 8 and a silicon oxide film 9. Again, the substrate 1 located in the n-MOS region 3 was implanted with ions such as P⁺ ions by using the electrode patterns 5 and the side-wall structure as masks, and a heat treatment was performed at 1030° C. for 5 seconds to form a source and a drain n-type diffusion layer 10 and 11 of an LDD structure. Moreover, the substrate 1 located in the p-MOS region 4 was implanted with ions such as B⁺ ions by using the electrode patterns 5 and the side-wall structure as masks, and a heat treatment was performed at 1030° C. for 5 seconds to form a source and drain p-type diffusion layer 12 and 13 of an LDD structure.

Figure 1B:
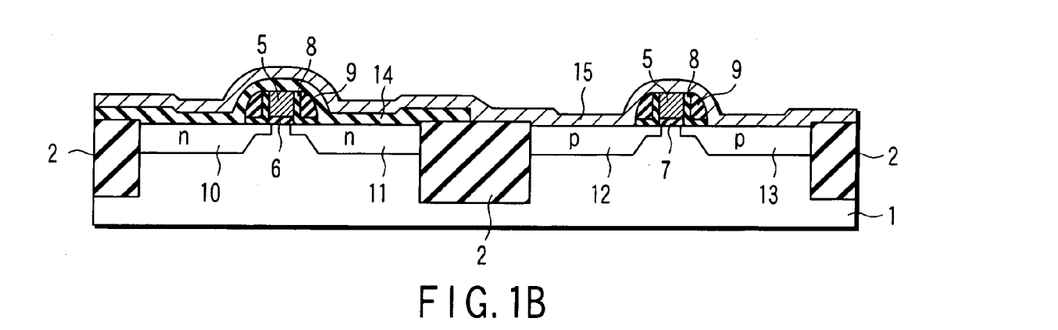
Figure 1C:
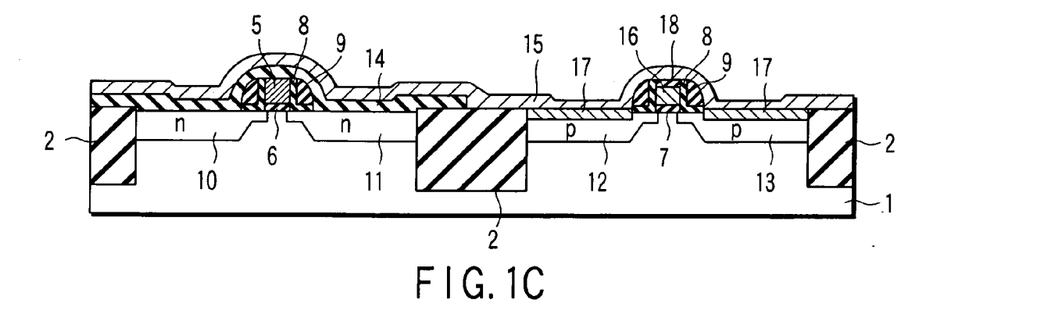
Figure 2B:
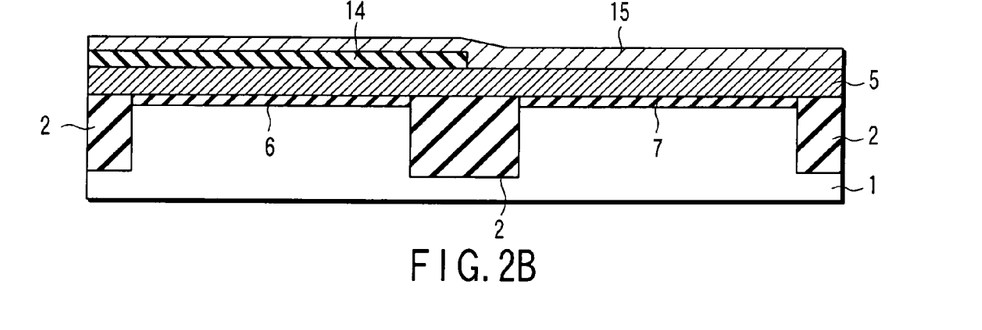
Figure 2C:
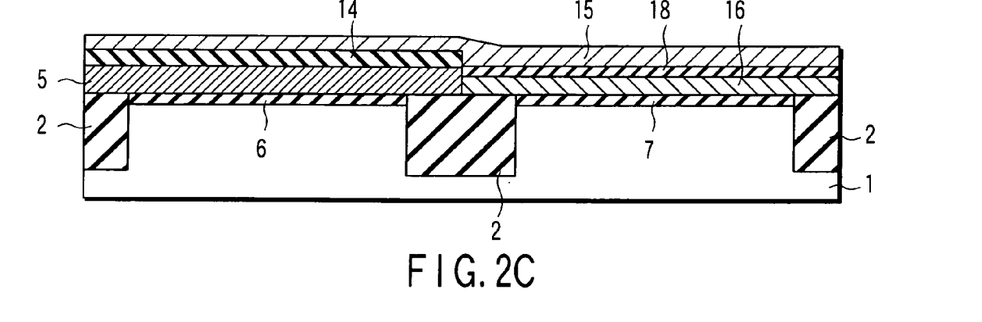

Next, a first insulating film made of, for example, a silicon nitride film of, for example, 10 nm in thickness was formed all over the surface. Then, a part of the first insulating film located in the p-MOS region was removed by etching selectively to form a first insulating film pattern 14 for masking the n-MOS region as shown in FIGS. 1B and 2B. Thereafter, a platinum (Pt) film 15, for example, of 18 nm in thickness was deposited all over the surface, and the Pt film was made to be in contact with the electrode pattern 5 in the p-MOS region that was exposed from the first insulating film pattern 14 and the surface of the substrate 1.

Subsequently, it was heated, for example, in a nitrogen atmosphere at 350° C. for 30 seconds. At this time, the Pt film 15 reacted with the electrode pattern 5 made of polycrystalline silicon in the p-MOS region, whereby a gate electrode 16 consisting of platinum silicide was formed in the p-MOS region as shown FIGS. 1C and 2C. At the same time, the Pt film 15 reacted with the exposed single crystal silicon substrate 1 to form a platinum silicide layer 17 on the surface of the source and the drain diffusion layer 12 and 13. Then, by oxidizing thermally, for example, in an oxygen atmosphere at 400° C. for 1 hour, a silicon oxide film 18 of, for example, about 2 nm in thickness was formed on the gate electrode 16 consisting of platinum silicide. At the same time, a silicon oxide film (not shown) of, for example, about 2 nm in thickness was formed on the platinum silicide layer 17.

Figure 1D:
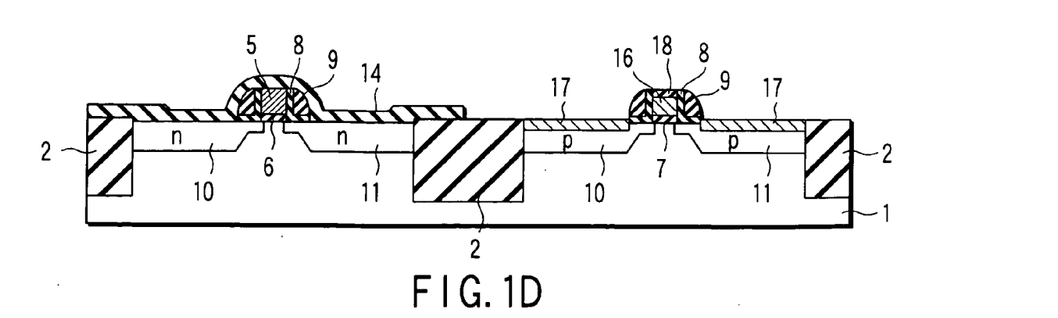
Figure 2D:
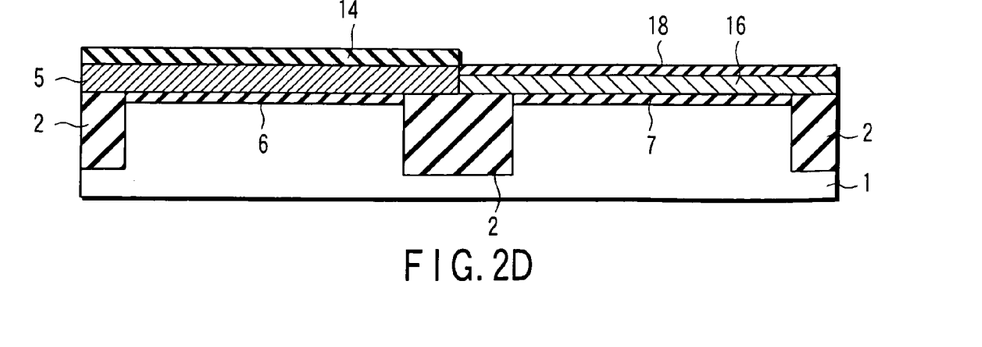

Subsequently, a non-reacting part of the Pt film 15 was dissolved away with a mixed acid solution of nitric acid, hydrochloric acid, and water mixed at a weight ratio of 1:3:4 as shown in FIGS. 1D and 2D. At this time, these gate electrodes 16 consisting of platinum silicide and the platinum silicide layer 17 were prevented from taking place dissolution by the mixed solution, because the silicon oxide film 18 was formed on the gate electrode 16 and the platinum silicide layer 17.

Figure 1E:
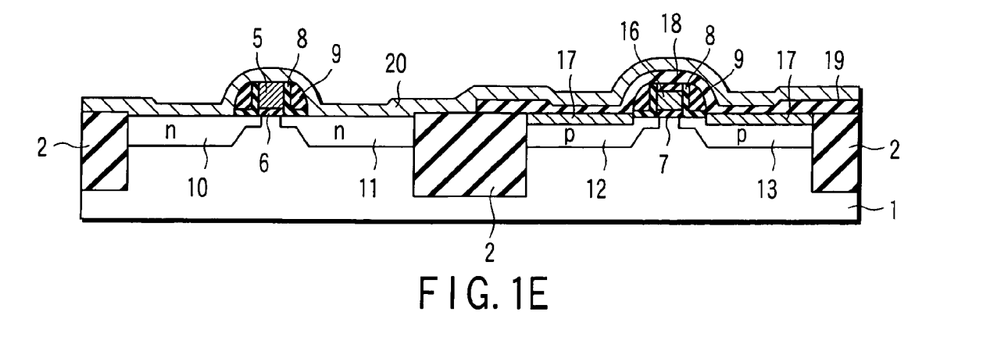
Figure 1F:
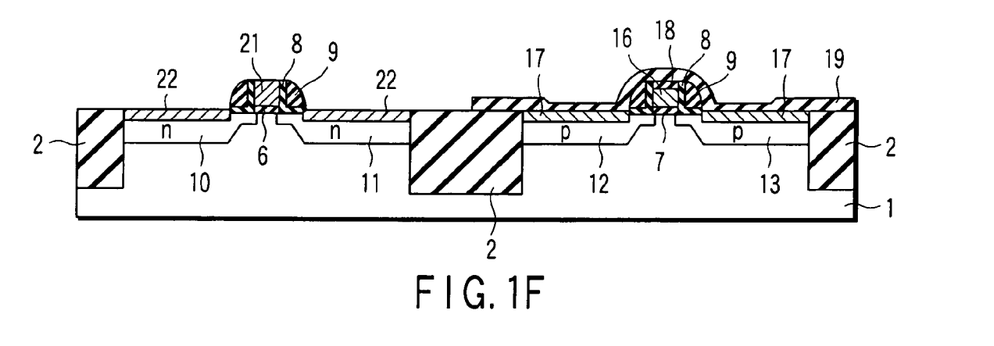
Figure 2E:
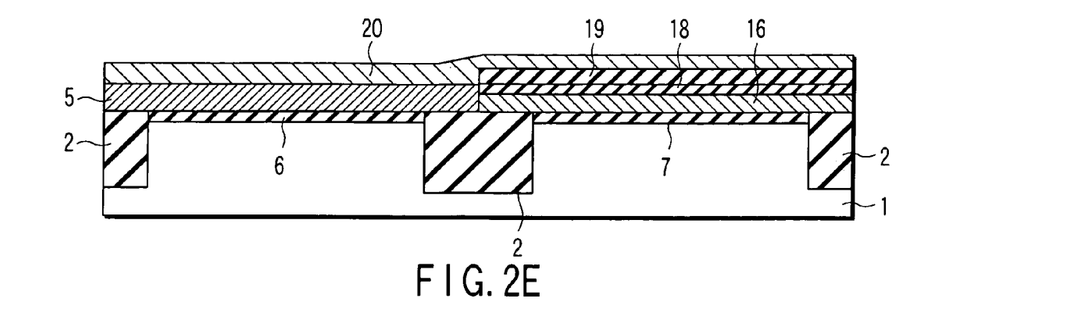
Figure 2F:
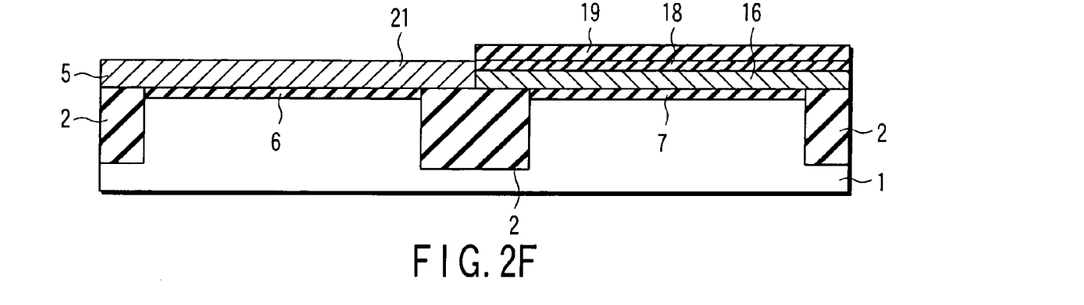

After the first insulating film pattern 14 was removed, a second insulating film made of a silicon oxide and having, for example, 10 nm in thickness was formed all over the surface. Then, a part of the second insulating film located in the n-MOS region was removed by etching selectively to form a second insulating film pattern 19 which masks the p-MOS region as shown in FIGS. 1E and 2E. Thereafter, an europium (Er) film 20 of, for example, 22 nm in thickness was deposited all over the surface, and the Er film 20 was made to be in contact with the electrode pattern 5 in the n-MOS region that was exposed from the second insulating film pattern 19 and the surface of the substrate 1.

Subsequently, it was heated, for example, in a nitrogen atmosphere at 350° C. for 30 seconds. At this time, the Er film 20 reacted with the electrode pattern 5 made of polycrystalline silicon in the n-MOS region, whereby a gate electrode 21 consisting of a europium silicide was formed in the n-MOS region as shown FIGS. 1F and 2F. At the same time, the Er film 20 reacted with the exposed single crystal silicon substrate 1, whereby a europium silicide layer 22 was formed on the surface of the source and the drain diffusion layer 10 and 11. Then, a non-reacting part of the Er film 20 was dissolved away with a mixed acid solution of sulfuric acid and hydrogen peroxide mixed at a weight ratio of 1:2. At this time, because the gate electrode 16 consisting of a platinum silicide in the p-MOS region and the platinum silicide layer 17 were not soluble in the mixed acid solution of sulfuric acid and hydrogen peroxide, they were not adversely affected by the mixed acid solution.

Figure 1G:
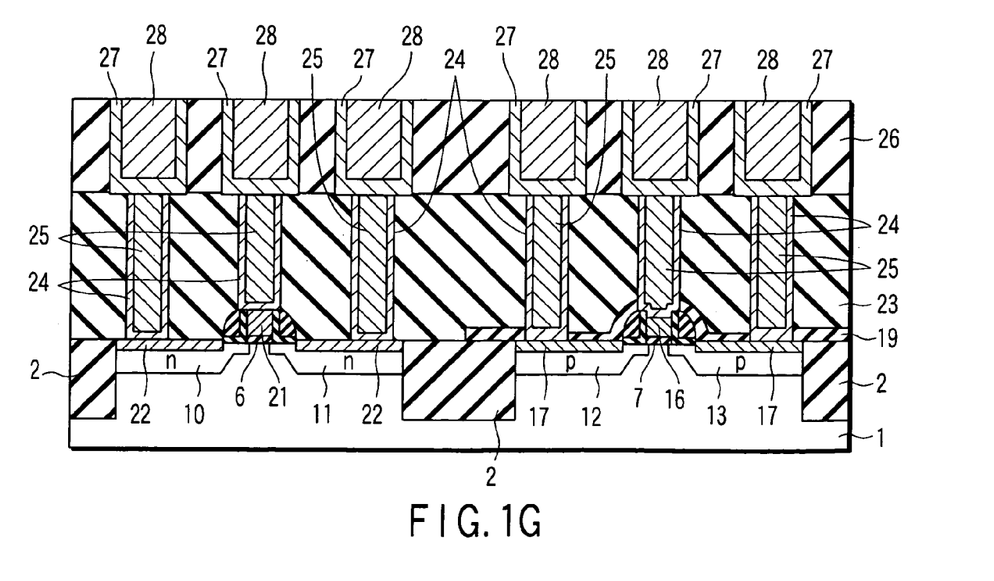

Subsequently, a first inter-layer insulating film 23 made of $SiO_2$ was deposited all over the surface with the condition that the second insulating film 19 remained as shown in FIG. 1G. Via holes were formed in the places corresponding to the europium silicide layer 22 and the gate electrode 21 on the surface of the n-type diffusion layers 10 and 11 of the first inter-layer insulating film 23, and the platinum silicide layer 17 and the gate electrode 16 on the surface of the p-type diffusion layers 12, 13. These via holes were filled with a tungsten film through a barrier film of, for example, Ti/TiN, and the surface was flattened with a chemical mechanical planerization (CMP) method, whereby each via fill 25 composed of tungsten was filled through a barrier film 24. Then, a second inner-layer insulating film 26 was deposited all over the surface. Trenches were formed in the places corresponding to the via fill 25 of the second inter-layer insulating film 26, and these trenches were filled with a copper film through a barrier film of TaN to flatten the surface with a CMP method. Consequently, by forming a copper wiring 28 which electrically connects with the via fill 25 through the barrier film 27, a CMOS transistor was manufactured.

As described above, according to Example 1, a silicide formation of the electrode pattern 5 located in the p-MOS region 4 is performed prior to a silicide formation of the electrode pattern 5 located in the n-MOS region 3. Consequently, gate electrodes 21 and 16 can be formed successfully both in the n-MOS region and the p-MOS region without a problem such as oxidation of the gate electrode 21 of silicide located in the n-MOS region 3. This makes it possible to manufacture a CMOS transistor having gate electrodes 16 and 21 of silicide with an appropriate work function of an n-MOS transistor and a p-MOS transistor, respectively.

EXAMPLE 2

FIGS. 3A to 3H are cross-sectional views each showing the steps of manufacturing a CMOS transistor in Example 2.

Figure 3A:
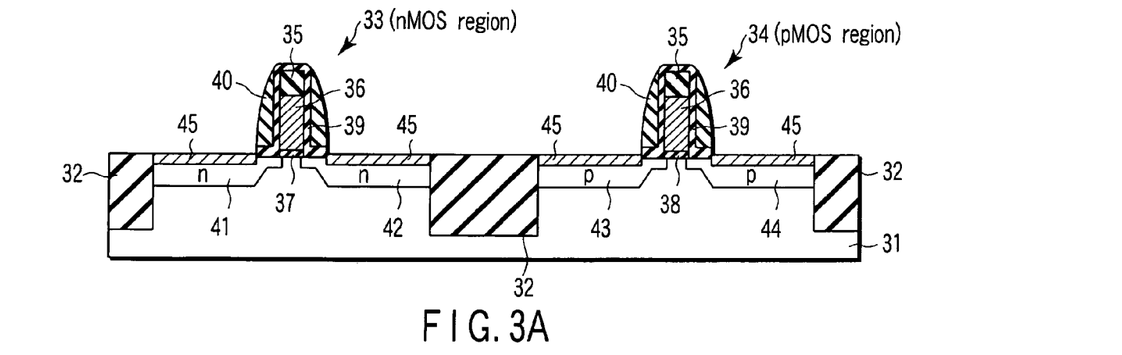
FIGS. 3A, 3B, 3C, 3D, 3E, 3F, 3G and 3H are cross-sectional views showing the steps of manufacturing a CMOS transistor in Example 2.

First, by forming an element isolator 32 on a single crystal silicon substrate 31 as shown in FIG. 3A, the surface of the single crystal silicon substrate 31 was isolated into a plurality of an n-MOS region 33 and a p-MOS region 34. Then, a gate insulating film such as a silicon oxynitride film was formed on the single crystal silicon substrate 31 located in the n-MOS region 33 and the p-MOS region 34 respectively, and a polycrystalline silicon film and a silicon oxide film were deposited successively all over the surface. Subsequently, the silicon oxide film was etched anisotropically using a resist pattern as a mask to form a plurality of silicon oxide patterns 35. The polycrystalline silicon film underneath the silicon oxide pattern was etched anisotropically using these silicon oxide patterns 35 as a mask, whereby a plurality of electrode patterns 36 were formed. Further, the silicon oxynitride film was removed by etching selectively using these electrode patterns 5, whereby gate insulating films 36 and 37 were formed respectively. The substrate 31 located in the n-MOS region 33 was implanted with ions such as As$^+$ ions using the silicon oxide pattern 35 as a mask, the substrate 31 located in the p-MOS region 34 was implanted with ions such as B$^+$ ions, and a heat treatment was performed at 800° C. for 5 seconds to form a shallow diffusion layer. Then, a silicon nitride film and a silicon oxide film were deposited successively. The silicon oxide film and the silicon nitride film were etched back to form a structure in which a side-wall part of the silicon oxide pattern 35 and the electrode patterns 36 was surrounded by a silicon nitride film 39 and a silicon oxide film 40. Again, the substrate 31 located in the n-MOS region 33 was implanted with ions such as P$^+$ ions using the silicon oxide film pattern 35 and the side-wall structure as masks, and a heat treatment was performed at 1030° C. for 5 seconds to form a source and a drain n-type diffusion layer 41 and 42 of an LDD structure. Moreover, the substrate 31 located in the p-MOS region 34 was implanted with ions such as B$^+$ ions using the silicon oxide film pattern 35 and the side-wall structure as masks, and a heat treatment was performed at 1030° C. for 5 seconds to form a source and drain p-type diffusion layer 43 and 44 of an LDD structure. Thereafter, a nickel (Ni) film of, for example, 10 nm in thickness was deposited all over the surface. A heat treatment was performed, for example, in a nitrogen atmosphere at 350° C. for 30 seconds to reacting with the exposed single crystal silicon substrate 31, whereby an nickel silicide layer 45 was formed on the surface of the n-type diffusion layers 41 and 42 and the p-type diffusion layers 43 and 44. A non-reacting Ni film was dissolved away with a mixed acid solution of sulfuric acid and hydrogen peroxide mixed at a weight ratio of 1:1.

Figure 3B:
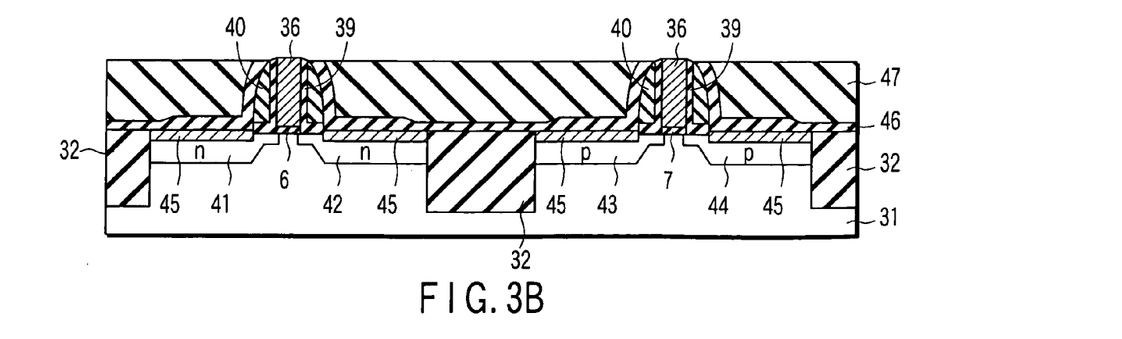

Subsequently, a silicon nitride film 46 of, for example, 20 nm in thickness and a first inter-layer insulating film 47 made of SiO$_2$ were deposited all over the surface as shown in FIG. 3B. A part of the first inter-layer insulating film 47, a part of the silicon nitride film 39, and all of the silicon oxide film 35 were processed with CMP and were flattened until the surface of the electrode pattern 36 was exposed.

Figure 3C:
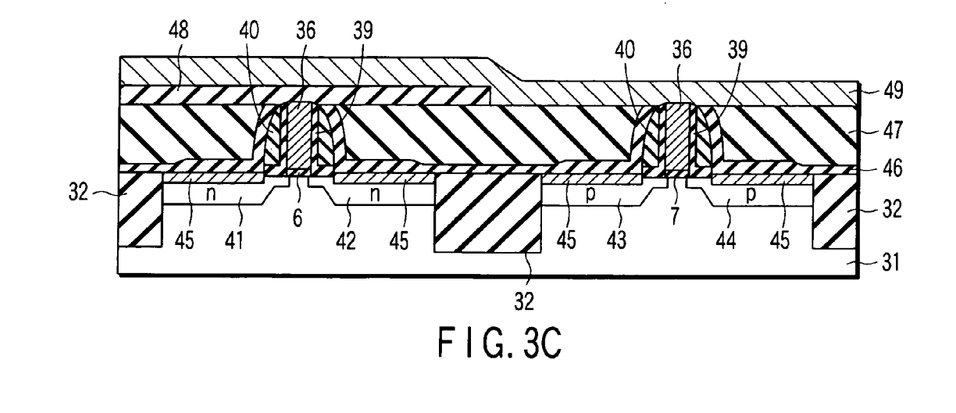
Figure 3D:
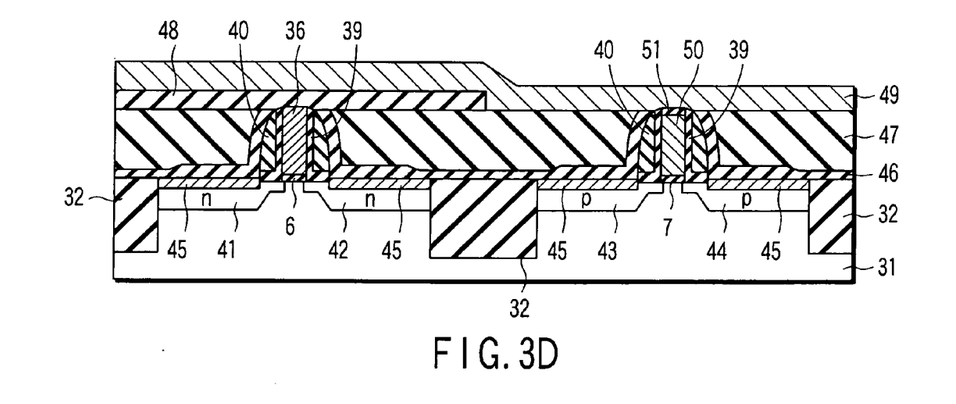

Then, the first insulating film made of a silicon oxide film of, for example, 10 nm in thickness was formed all over the surface as shown in FIG. 3C. Then, a part of the first insulating film located in the p-MOS region was removed by etching selectively to form a first insulating film pattern 48 which masks the n-MOS region. Thereafter, a palladium (Pd) film 49 of, for example, 17 nm in thickness was deposited all over the surface, and the Pd film 49 was made to be in contact with the surface of the electrode pattern 36 located in the exposed p-MOS region from the first insulating film pattern 48.

Figure 3E:
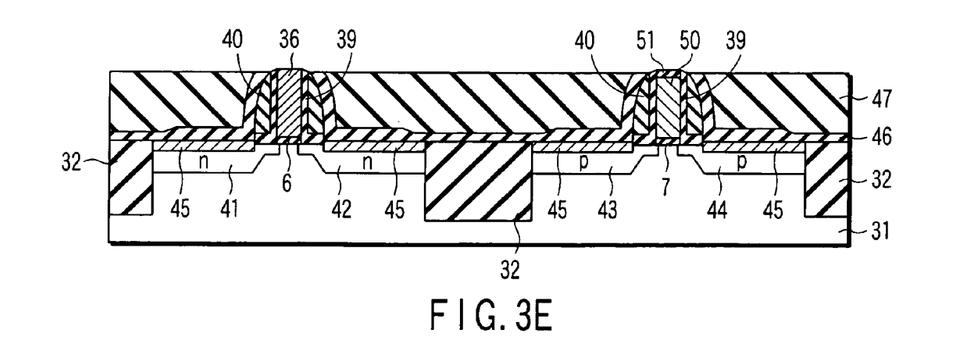

Subsequently, it was heated, for example, in a nitrogen atmosphere at 350° C. for 30 seconds. At this time, the Pd film 49 reacted with the electrode pattern 36 made of polycrystalline silicon in the p-MOS region, whereby a gate electrode 50 consisting of a palladium silicide was formed in the p-MOS region as shown FIG. 3D. Then, an oxidation was performed in an ozone plasma at 200° C. for about 1 minute, for example, whereby a silicon oxide film 51 of, for example, about 2 nm in thickness was formed on the gate electrode 50 consisting of palladium silicide. Then, a non-reacting part of the Pd film 49 was dissolved away with a mixed acid solution of sulfuric acid and hydrochloric acid mixed at a weight ratio of 1:3 as shown in FIG. 3E. At this time, the gate electrode 50 consisting of the palladium silicide was prevented from taking place dissolution by the mixed acid solution, because the silicon oxide film 51 was formed on the gate electrode 50.

Figure 3F:
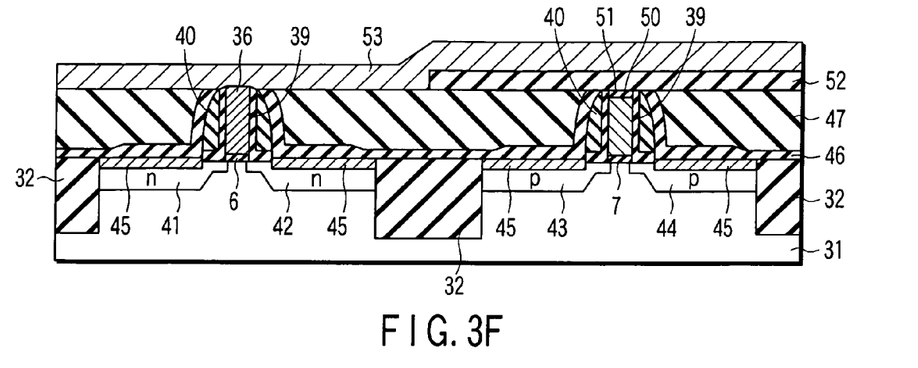
Figure 3G:
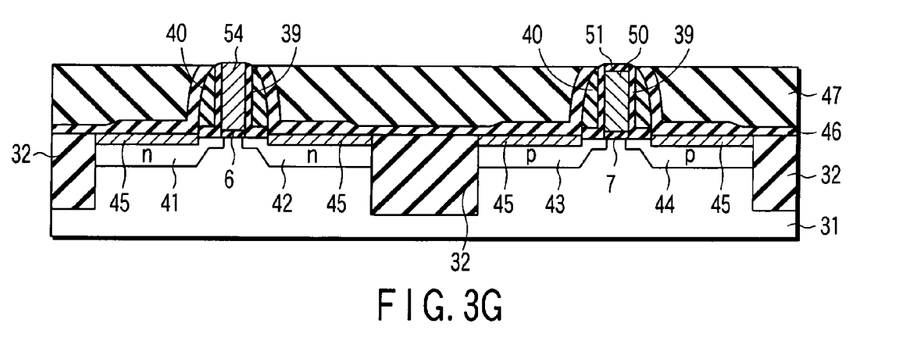

After the first insulating film pattern 48 was removed, a second insulating film made of a silicon nitride and having, for example, 10 nm in thickness was formed all over the surface. A part of the second insulating film located in the n-MOS region was removed by etching selectively to form a second insulating film pattern 52 which masks the p-MOS region as shown in FIG. 3F. Subsequently, an yttrium (Y) film 53 of, for example, 24 nm in thickness was deposited all over the surface, and the Y film 53 was made to be in contact with the surface of the electrode pattern 36 located in the n-MOS region that was exposed from the second insulating film pattern 52.

Subsequently, it was heated, for example, in a nitrogen atmosphere at 350° C. for 30 seconds. At this time, the Y film 53 reacted with the electrode pattern 36 made of polycrystalline silicon in the n-MOS region, whereby a gate electrode 54 consisting of an yttrium silicide was formed in the n-MOS region as shown FIG. 3G. Then, a non-reacting part of the Y film 53 was dissolved away with a mixed acid solution of sulfuric acid and hydrogen peroxide mixed at a weight ratio of 1:1. At this time, the gate electrode 50 was not adversely affected by the mixed acid solution, because the gate electrode 50 consisting of the palladium silicide in the p-MOS region is not soluble in the mixed acid solution of sulfuric acid and hydrogen peroxide.

Figure 3H:
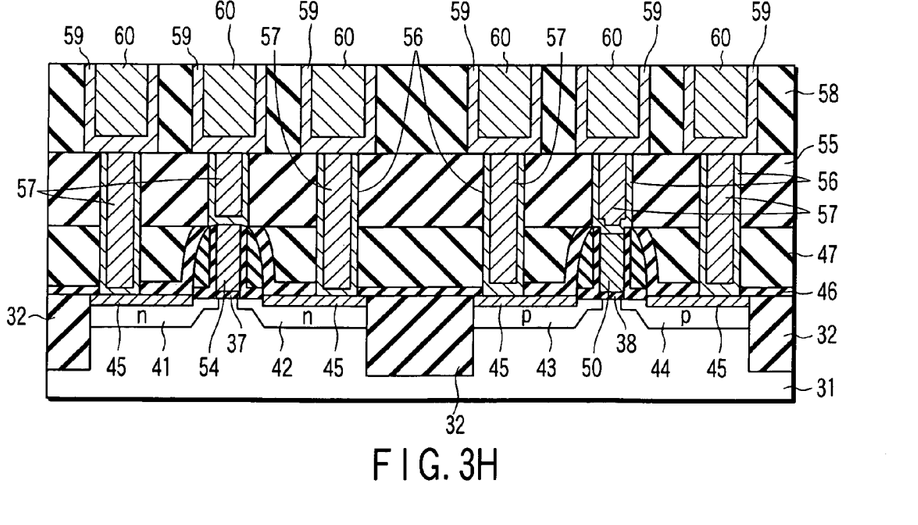

Subsequently, a second inter-layer insulating film 55 made of SiO$_2$ was deposited all over the surface as shown in FIG. 3H. Via holes were formed in the places corresponding to the nickel silicide layer 45 at the surface of the n-type diffusion layers 41 and 42 and p-type diffusion layers 43 and 44 of the second inter-layer insulating film 55 and the first inter-layer insulating film 47, and the gate electrodes 50 and 54 of the second inter-layer insulating film 55. These via holes were filled with a tungsten film through a barrier film of, for example, Ti/TiN, and the surface was flattened with a CMP method, whereby each via fill 57 made of tungsten was filled through a barrier film 56. Then, a third inner-layer insulating film 58 made of SiO$_2$ was deposited all over the surface. Trenches were formed in the places corresponding to the via fill 57 of the third inner-layer insulating film 58. These trenches were filled with a copper film through a barrier film of TaN and the surface was flattened with a CMP method to form a copper wiring 60 which electrically connects with the via fill 57 through the barrier film 59, whereby a CMOS transistor was manufactured.

As described above, according to Example 2, a silicide formation of the electrode pattern 36 located in the p-MOS region 34 is performed prior to a silicide formation of the electrode pattern 36 located in the n-MOS region 33. As a consequence, gate electrodes 54 and 50 of a metal silicide can be formed successfully both in the n-MOS region and the p-MOS region without a problem such as oxidation of the gate electrode 54 of silicide located in the n-MOS region 33. This makes it possible to manufacture a CMOS transistor having gate electrodes 50 and 54 of silicide with an appropriate work function of an n-MOS transistor and a p-MOS transistor respectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming an electrode pattern made of at least one element selected from silicon and germanium on a gate insulating film in an n-MOS region and a p-MOS region of a semiconductor substrate;

masking the n-MOS region including the first electrode pattern with a first insulating film pattern;

forming a first metal film made of Pd, Pt, Rh, Ir, or their alloys all over the surface;

forming a gate electrode consisting of a reactant between the first metal and at least one element selected from silicon and germanium by heating to react the first metal film with the electrode pattern in the p-MOS region contacting with the first metal film;

forming an oxide film of at least one element selected from silicon and germanium on the surface of the gate electrode by oxidation;

dissolving away a non-reacting first metal film with an acid solution in which the first metal is soluble;

removing the first insulating film pattern;

masking the p-MOS region including the electrode pattern with a second insulating film pattern;

forming a second metal film made of Er, Y, Gd, Tm, Dy, Ce, or their alloys all over the surface;

forming a gate electrode consisting of a reactant between the second metal and at least one element selected from silicon and germanium by heating to react the second metal film with the electrode pattern in the n-MOS region contacting with the second metal film; and dissolving away a non-reacting second metal film with an acid solution in which the second metal is soluble.

2. The method according to claim 1, wherein the gate insulating film is a silicon oxynitride film, a silicon oxide film, or a silicon nitride film.

3. The method according to claim 1, wherein the first and second insulating film patterns are formed by the deposition of a silicon oxide film and patterning, respectively.

4. The method according to claim 1, wherein heating to react the first metal film with the electrode pattern in the p-MOS region is performed in a non-oxidizing atmosphere or a vacuum at 250 to 450° C.

5. The method according to claim 1, wherein the gate electrode in the p-MOS region is made from a silicide of Pd, Pt, Rh, Ir or their alloys, and silicon.

6. The method according to claim 1, wherein the acid solution in which the first metal is soluble is a mixed acid solution of nitric acid and hydrochloric acid.

7. The method according to claim 1, wherein the oxidation is performed in an atmosphere containing oxygen at 300 to 600° C.

8. The method according to claim 7, wherein the atmosphere containing oxygen is either a pure oxygen atmosphere, a mixed gas atmosphere of oxygen and an inert gas, or a steam atmosphere.

9. The method according to claim 1, wherein the oxidation is performed by an ozone plasma process.

10. The method according to claim 1, wherein the thickness of the oxide film is 3 to 10 nm.

11. The method according to claim 1, wherein heating to react the second metal film with the electrode pattern in the n-MOS region is performed in a non-oxidizing atmosphere or a vacuum at 250 to 450° C.

12. The method according to claim 1, wherein the gate electrode in the n-MOS region is made from a silicide of Er, Y, Gd, Tm, Dy, Ce or their alloys, and silicon.

13. The method according to claim 1, wherein the acid solution in which the second metal is soluble is a mixed acid solution of sulfuric acid and hydrogen peroxide.

14. The method according to claim 1, wherein formation of the gate electrode in the p-MOS region is performed prior to formation of the gate electrode in the n-MOS region.

* * * * *